United States Patent
Lee et al.

(10) Patent No.: US 10,438,909 B2
(45) Date of Patent: Oct. 8, 2019

(54) RELIABLE PASSIVATION FOR INTEGRATED CIRCUITS

(71) Applicant: GLOBALFOUNDRIES Singapore Pte. Ltd., Singapore (SG)

(72) Inventors: Fook Hong Lee, Singapore (SG); Juan Boon Tan, Singapore (SG); Ee Jan Khor, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/429,198

(22) Filed: Feb. 10, 2017

(65) Prior Publication Data

US 2017/0236792 A1   Aug. 17, 2017

Related U.S. Application Data

(60) Provisional application No. 62/294,314, filed on Feb. 12, 2016.

(51) Int. Cl.
*H01L 23/31* (2006.01)
*H01L 23/525* (2006.01)
(Continued)

(52) U.S. Cl.
CPC .............. *H01L 24/03* (2013.01); *G03F 1/36* (2013.01); *G06F 17/5072* (2013.01);
(Continued)

(58) Field of Classification Search
None
See application file for complete search history.

(56) References Cited

U.S. PATENT DOCUMENTS

| | | | |
|---|---|---|---|
| 2004/0166659 A1* | 8/2004 | Lin | H01L 21/768 438/611 |
| 2004/0251549 A1* | 12/2004 | Huang | H01L 21/76804 257/758 |

(Continued)

FOREIGN PATENT DOCUMENTS

| JP | 09293723 A | * 11/1997 |
|---|---|---|
| JP | 09293723 A | * 11/1997 |

OTHER PUBLICATIONS

English translation of JP09293723.*
(Continued)

*Primary Examiner* — Charles D Garber
*Assistant Examiner* — Xiaoming Liu
(74) *Attorney, Agent, or Firm* — Thompson Hine LLP

(57) ABSTRACT

Device and method for forming a device are presented. A substrate having circuit component and a back-end-of-line (BEOL) dielectric layer with interconnects is provided. A pad dielectric layer is formed over the BEOL dielectric layer. The pad dielectric layer includes a pad via opening which exposes a surface of one of the interconnects in the BEOL dielectric layer. A pad interconnect is formed on the pad dielectric layer and the pad interconnect is coupled to one of the interconnect in the BEOL dielectric by a pad via contact in the pad via opening. The pad interconnect comprises a pad interconnect pattern which is devoid of 90° angles and any angled structures contained in the pad interconnect pattern less than 90°. A passivation layer is formed on the substrate. The passivation layer lines the pad interconnect and covers an exposed surface of the pad dielectric layer.

7 Claims, 13 Drawing Sheets

(51) Int. Cl.
*H01L 21/768* (2006.01)
*H01L 23/00* (2006.01)
*G06F 17/50* (2006.01)
*G03F 1/36* (2012.01)
*H01L 23/528* (2006.01)
*H01L 23/532* (2006.01)

(52) U.S. Cl.
CPC ........ *G06F 17/5081* (2013.01); *H01L 21/768* (2013.01); *H01L 23/3192* (2013.01); *H01L 23/525* (2013.01); *H01L 23/528* (2013.01); *H01L 23/5329* (2013.01); *H01L 24/02* (2013.01); *H01L 24/05* (2013.01); *H01L 23/53214* (2013.01); *H01L 23/53228* (2013.01); *H01L 24/45* (2013.01); *H01L 2224/0235* (2013.01); *H01L 2224/0239* (2013.01); *H01L 2224/02313* (2013.01); *H01L 2224/0345* (2013.01); *H01L 2224/0391* (2013.01); *H01L 2224/03614* (2013.01); *H01L 2224/03622* (2013.01); *H01L 2224/0401* (2013.01); *H01L 2224/04042* (2013.01); *H01L 2224/05548* (2013.01); *H01L 2224/05552* (2013.01); *H01L 2224/05559* (2013.01); *H01L 2224/05624* (2013.01); *H01L 2224/45144* (2013.01); *H01L 2224/45147* (2013.01); *H01L 2924/05042* (2013.01); *H01L 2924/05442* (2013.01)

(56) References Cited

U.S. PATENT DOCUMENTS

| | | | |
|---|---|---|---|
| 2005/0161825 A1* | 7/2005 | Watanabe | H01L 21/76805 257/758 |
| 2005/0227490 A1* | 10/2005 | Hsieh | H01L 21/76819 438/692 |
| 2005/0280800 A1* | 12/2005 | Laiding | G03F 1/36 355/77 |
| 2006/0063364 A1* | 3/2006 | Stephens | H01L 21/28088 438/585 |

OTHER PUBLICATIONS

Huang et al., Thin film cracking and ratcheting caused by temperature cycling, J. Mater Res., 2000, pp. 1239-1242, vol. 15, No. 6.

* cited by examiner

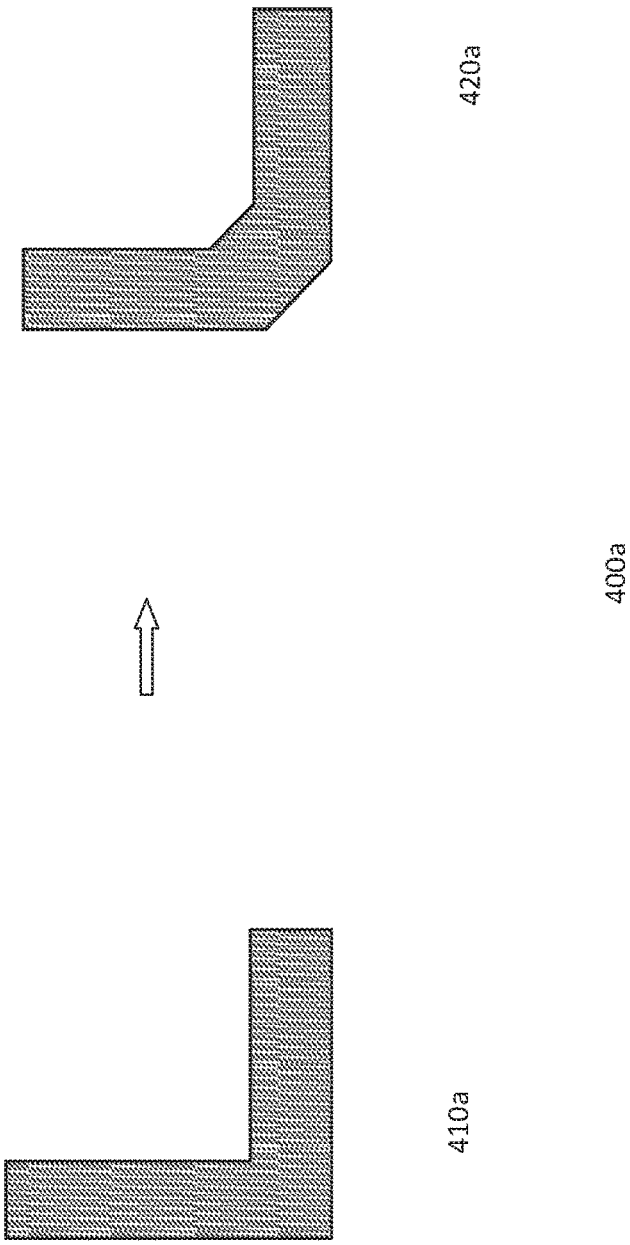

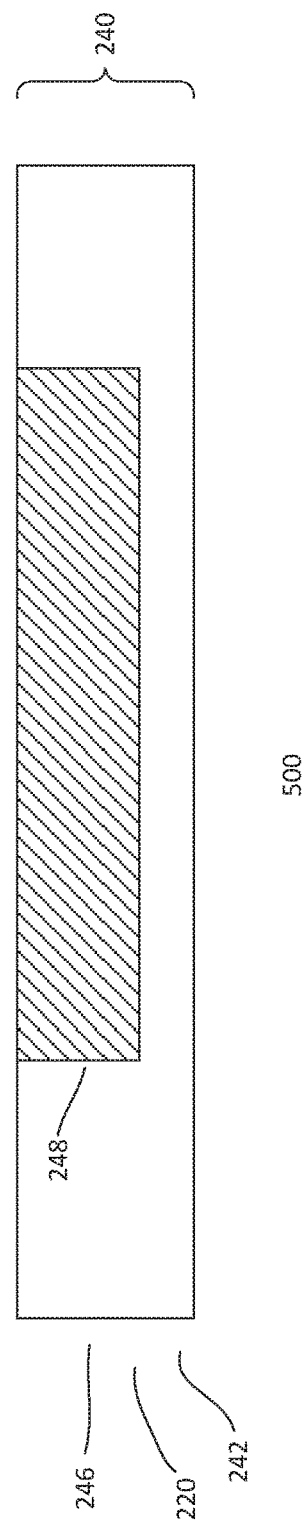

RELIABLE PASSIVATION FOR INTEGRATED CIRCUITS

CROSS-REFERENCE TO RELATED APPLICATION

This application claims the priority benefit of U.S. Provisional Application Ser. No. 62/294,314, filed on Feb. 12, 2016, which is herein incorporated by reference in its entirety.

BACKGROUND

In semiconductor device fabrication, back-end-of-line (BEOL) wafer processing generally involves creating various interconnecting metal layers that may be interconnected by vias. Wire bonding pads or pad interconnects are connected to the interconnects and are used to connect an integrated circuit (IC) to other ICs or electronic devices. Wire bonds are attached to the wire bonding pads. The wire bonds may include, for example, gold or copper materials. For example, copper wire bonds may be used more commonly due to its low cost.

However, the environmental conditions may influence the performance and reliability of automotive equipment. For instance, metal corrosion which is detrimental to reliability of devices is observed in such multi-layered systems during thermal cycles. Therefore, after semiconductor devices have been packaged, a passivation integrity testing (PIT) is performed to assess the liability of the device. During thermal cycle testing, temperature is changed, for example, from −65° C. to 150° C. The PIT includes thermal cycles. For example, 200 X thermal cycles are performed during the PIT. A passivation stack on the pad interconnects is easily destroyed and moisture enters into the inside of the device, causing a failure in the PIT.

The present disclosure relates to providing more reliable pad schemes, which are compatible with the materials of the wire bond and pass the chip package interaction (CPI) qualification requirement, and the methods of manufacturing the same.

SUMMARY

Embodiments of the present disclosure generally relate to semiconductor device and method of forming a semiconductor device. In one embodiment, a method of forming a semiconductor device is disclosed. The method includes providing a substrate having circuit component and a pad dielectric layer over a back-end-of-line (BEOL) dielectric layer with interconnects. The pad dielectric layer is formed over the BEOL dielectric layer and includes a pad via opening which exposes a surface of one of the interconnects in the BEOL dielectric layer. A pad conductive layer is formed on a surface of the substrate and the pad conductive layer fills the pad via opening and covers the pad dielectric layer. The pad conductive layer is patterned to form a pad interconnect having a pad interconnect pattern which is devoid of 90° angles and any angled structures contained in the pad interconnect pattern less than 90°. A passivation layer is formed on the substrate surface to line the pad interconnect and cover an exposed surface of the pad dielectric layer. The interconnect pattern which is devoid of 90° angles increases the integrity of the passivation layer.

In another embodiment, a method for forming a semiconductor device is presented. The method includes providing a substrate prepared with circuit component and a back-end-of-line (BEOL) dielectric layer with interconnects. A pad level having a pad via level and a pad interconnect level is formed over the BEOL dielectric layer. The pad via level includes a pad dielectric layer and a pad via opening which exposes a surface of one of the interconnects in the BEOL dielectric layer. A pad level layout is designed. The pad level includes a pad interconnect pattern which is devoid of 90° angles and any angled structures contained in the pad interconnect pattern less than 90°. A pad level reticle based on the pad level layout is formed. A passivation layer is formed on the substrate surface. The passivation layer lines the pad interconnect and covers an exposed surface of the pad dielectric layer.

In yet another embodiment, a semiconductor device is disclosed. The device includes a substrate prepared with circuit component and a back-end-of-line (BEOL) dielectric layer with interconnects. A pad dielectric layer is disposed over the BEOL dielectric layer and the pad dielectric layer includes a pad via opening which exposes a surface of one of the interconnects in the BEOL dielectric layer. A pad interconnect is disposed on the pad dielectric layer. The pad interconnect is coupled to one of the interconnects in the BEOL dielectric by a pad via contact in the pad via opening. The pad interconnect comprises a pad interconnect pattern which is devoid of 90° angles and any angled structures contained in the pad interconnect pattern less than 90°. The passivation layer is disposed on the substrate surface. The passivation layer lines the pad interconnect and covers the surface of the pad dielectric layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 4a-4d show top views of exemplary wiring patterns and their corresponding modified wiring patterns; and FIGS. 5a-5f show cross-sectional views of an embodiment of a process for forming a device.

DETAILED DESCRIPTION

Embodiments generally relate to devices, for example, semiconductor devices or integrated circuits (ICs). More particularly, embodiments relate to forming pad interconnects in ICs. The ICs can be any type of IC, such as dynamic or static random access memories, signal processors, microcontrollers or system-on-chip (SoC) devices. Other types of devices may also be useful. The devices or ICs can be incorporated into or used with, for example, consumer electronic products, or other types of products.

The fabrication of devices may involve the formation of features on a substrate that make up circuit components, such as transistors, resistors and capacitors. The devices are interconnected, enabling the IC to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of the IC, numerous reticles may be used for different patterning processes. Furthermore, a plurality of ICs may be formed on the wafer in parallel.

Figure 1:
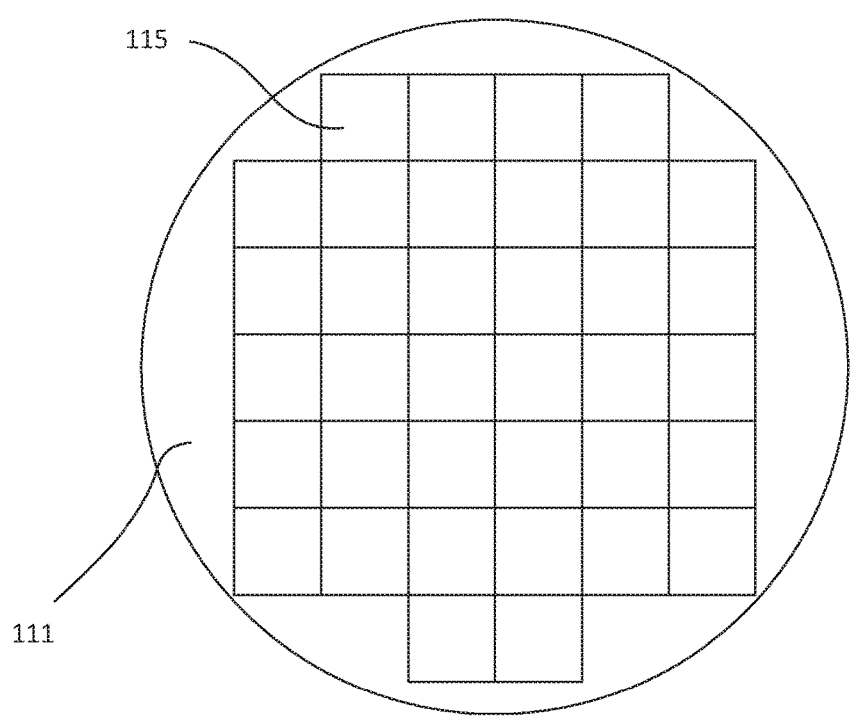
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer as well as doped with other types of dopants or dopant concentrations may also be useful.

The wafer includes an active surface 111 on which devices 115 are formed. A plurality of devices may be formed on the wafer in parallel. The devices, for example, are arranged in rows along a first (x) direction and columns along a second (y) direction. Separating the devices are dicing channels. After processing is completed, the wafer is diced along the dicing channels to singulate the devices into individual chips.

Figure 2:
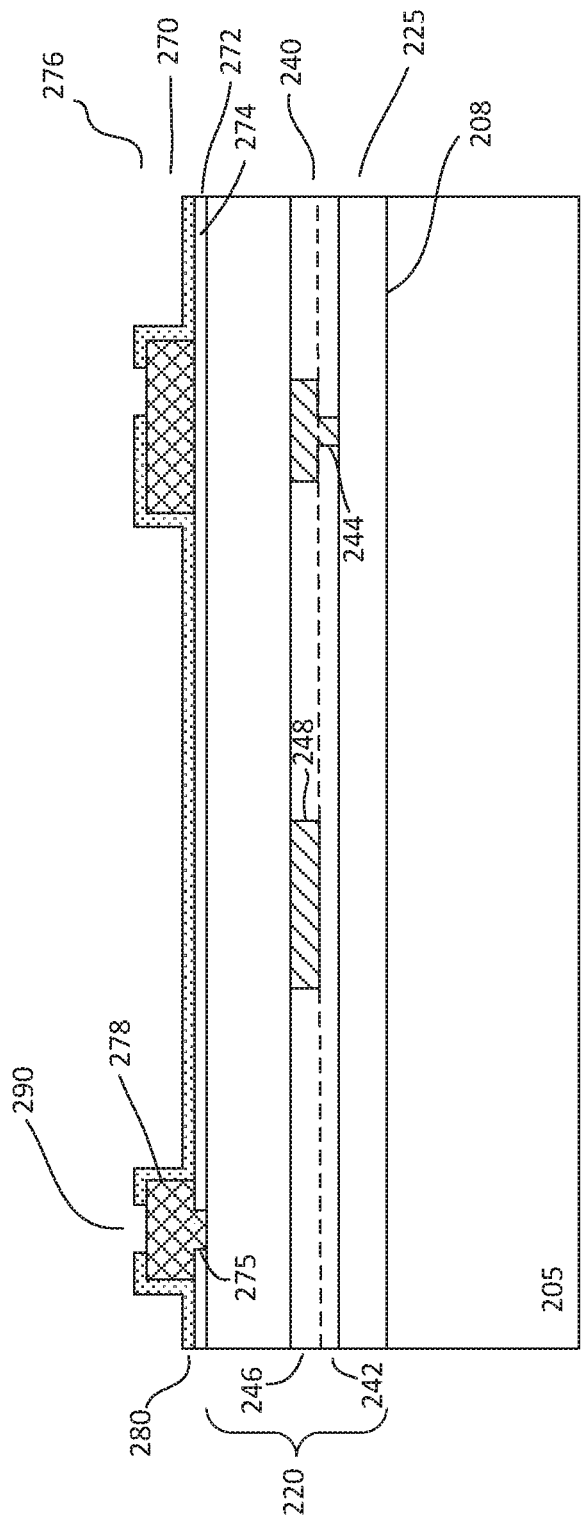
FIG. 2 shows a simplified cross-sectional view of a device.

FIG. 2 shows a simplified embodiment of a device 115. The device, for example, is an integrated circuit (IC). Other types of devices may also be useful. The device, for example, may be formed in parallel on a wafer and subsequently singulated. The device includes a substrate 205. The device, for example, may be a part of the wafer, as described in FIG. 1. Common elements may not be described or described in detail. The substrate, for example, may be a semiconductor substrate, such as a silicon substrate. Other types of substrates or wafers may also be useful.

The substrate of the device may include various types of regions (not shown). Such regions, for example, may include high voltage (HV), low voltage (LV) and intermediate or medium voltage (MV) regions. High voltage devices or components are formed in the high voltage region, low voltage components are formed in the low voltage region and intermediate voltage components are formed in the intermediate voltage region. The components, for example, are metal oxide semiconductor (MOS) transistors. Other types of components or device regions may also be useful.

Front end of line (FEOL) processing is performed on the substrate. For example, isolation regions are formed to isolate different device regions. The isolation regions, for example, are shallow trench isolation (STI) region. Other types of isolation regions may also be useful. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. Gates are formed by, for example, forming gate oxide layer, such as thermal silicon oxide followed by a gate electrode layer, such as polysilicon. The gate electrode may be doped. Other types of gate materials may also be useful. Separate processes may be performed for forming gate dielectrics of the different voltage transistors. This is due to, for example, different gate oxide thicknesses associated with the different voltage transistors. For example, HV transistor will have a thicker gate dielectric than a LV transistor.

The gate layers, in one embodiment, may be formed on the active surface of the substrate 208. After the gate layers are formed on the active surface of the substrate 208, they are patterned to form gates. For example, a photoresist mask may be used for a reactive ion etch (RIE) to pattern the gate layers to form the gates. Source/drain (S/D) regions are formed adjacent to the gates. The S/D regions are heavily doped regions. Depending on the type of device, the S/D regions may be heavily doped n-type or p-type regions. For n-type transistors, S/D regions are heavily doped n-type regions and for p-type transistors, S/D regions are heavily doped p-type regions. Lightly doped regions may be provided for the S/D regions. Dielectric sidewall spacers may be provided on sidewalls of the gates to facilitate forming lightly doped regions. Separate implants may be employed to form different doped regions using, for example, implant masks, such as photoresist mask.

After forming transistors, back-end-of-line (BEOL) processing is performed. The BEOL process includes forming interconnects in a BEOL dielectric layer 220. The BEOL dielectric includes a plurality of interlevel dielectric (ILD) layers 240. The interconnects connect the various components of the IC to perform the desired functions. An ILD layer includes a metal level 246 and a contact level 242. The metal level includes conductors or metal lines 248 while the contact level includes contacts 244. The conductors and contacts may be formed of a metal, such as copper, copper alloy, aluminum, tungsten or a combination thereof. Other suitable types of metal, alloys or conductive materials may also be useful.

In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

As discussed, a device may include a plurality of ILD layers or levels 240. For example, x number of ILD levels may be provided. For example, 5 ILD levels (x=5) may be provided. Other number of ILD levels may also be useful. The number of ILD levels may depend on, for example, design requirements or the logic process involved. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. For the first contact level, it may be referred to as CA.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a pattern resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. The first metal level M1 and CA may be referred as the first ILD level 225.

The process continues to form additional ILD layers. For example, the process continues to form upper ILD levels. The upper ILD levels may include ILD level 2 to ILD level x. For example, in the case where x=5 (5 levels), the upper levels include ILD levels from 2 to 5, which includes M2 to M5. The number of ILD layers may depend on, for example, design requirements or the logic process involved. These ILD layers may be referred to as intermediate ILD layers. The intermediate ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed, forming conductor and contacts in the intermediate ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be a nitrogen doped barrier low-k (nBLOK) layer. Other types of dielectric materials for the dielectric liner may also be useful.

The uppermost ILD level (e.g., i=x) may have different design rules, such as critical dimension (CD), than the lower ILD levels. For example, the top metal level Mx may have a larger CD than the lower metal levels M1 to Mx-1. For example, the uppermost or top metal level may have a CD which is 2X or 6X the CD of the lower metal levels. The uppermost metal level may be referred to as the fat metal level.

A pad level 270 is disposed over the uppermost ILD level. The pad level includes a pad via level 272 and a pad interconnect level 276. The pad via level includes a pad dielectric layer 274. The pad via level includes pad via contacts 275 in the pad dielectric layer and the pad interconnect level includes pad interconnects 278. A pad interconnect is coupled to an interconnect in the top metal level Mx. The top metal level Mx is, for example, a copper or copper alloy level. In one embodiment, the pad interconnects and pad via contacts are aluminum or aluminum alloy, such as aluminum-copper. Other types of pad interconnects and pad via contacts may also be useful. The pad interconnects, for example, are interconnect lines having different patterns.

A passivation layer 280 is disposed over the surface of the pad dielectric layer. The passivation, for example, is a dielectric layer. The passivation layer serves to protect the device from the environment. For example, the passivation layer reduces corrosion caused by exposure to the environment. The passivation layer may be a composite passivation layer having multiple layers. In one embodiment, the pad dielectric layer includes a silicon oxide and a silicon nitride (oxide/nitride) stack. The passivation layer includes pad openings 290, exposing pad interconnects in the pad level. As shown, two pad openings are provided in the final passivation layer to expose two pad interconnects. However, it is understood that the device includes may be other number of pad openings and pad interconnects. The number of pad openings, for example, depends on the number of pad interconnects. The pad interconnects provide external connections to the device. For example, the pad openings provide bonding areas for wire bonds or bump contacts for wafer level or flip-chip packaging. Additionally, a polyimide layer may be provided over the pad for metal routing.

Figure 3:
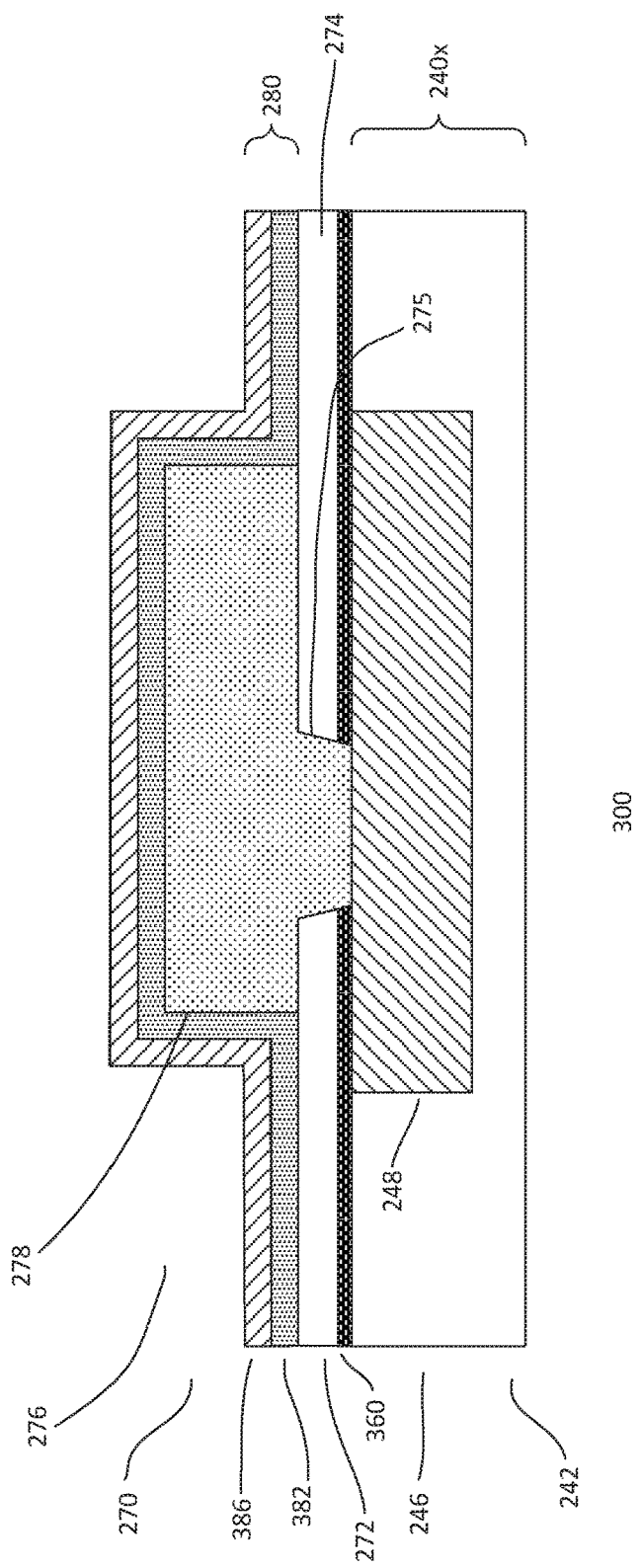
FIG. 3 shows a cross-sectional view of an embodiment of a device.

FIG. 3 shows a more detail cross-sectional view of a portion of a device 300. As shown, the device illustrates a portion of the device with the uppermost ILD level 240x and pad level 270. An ILD cap layer 360 is provided over the uppermost ILD level. The uppermost ILD layer includes an uppermost metal level $M_x$ and a via level $V_{x-1}$. The uppermost metal level $M_x$ includes a metal interconnect 248. A cap layer 360 is disposed over the uppermost ILD level. The cap layer may serve as an etch stop layer. The cap layer, in one embodiment, is a silicon nitride layer. Other types of cap layer may also be useful. A thickness of the cap layer may be about >1000 Å. Other thicknesses may also be useful.

A pad dielectric layer 274 is provided over the cap layer. The pad dielectric layer, for example, serves as a pad via level of the pad level. In one embodiment, the pad dielectric layer is a silicon oxide layer. Other types of dielectric materials may also be useful. A pad via opening is provided in the pad dielectric and cap layers. The pad via opening exposes the top surface of the interconnect in the uppermost ILD level. In one embodiment, the pad via opening is at least 3 um in diameter. A conductive pad interconnect 278 and conductive pad via contact 275 are disposed in the pad level. For example, the pad via contact is disposed in the pad via opening and the pad interconnect is disposed on the pad dielectric layer. The pad interconnect is coupled to the interconnect in the upper most ILD level by the pad via contact. The pad interconnect and pad via contact may be formed of the same material. For example, the pad interconnect and pad via contact may be aluminum or aluminum alloy, such as aluminum copper. Other materials or configurations of conductive pad interconnects and pad via contacts may also be useful.

A passivation layer 280 is disposed over the pad interconnect. The passivation layer, as shown, lines the pad interconnect and surface of the pad dielectric layer. In one embodiment, the passivation layer includes an oxide/nitride stack. Other types of passivation layers or stacks may also be useful. The thickness of oxide layer may be about 4,000-6,000 Å and the thickness of the nitride layer may be about 4,000-6,000 Å. Preferably, the thickness of the oxide layer is about 5,000 Å while the thickness of the nitride layer is about 4,800 Å. Other thicknesses may also be useful.

As discussed, a pad interconnect may have various line patterns for routing a connection from an underlying interconnect, for example in Mx, to a pad opening in the passivation layer. Although the pad opening is not shown, it exists, for example, in another cross section of the device. In addition, the device may include numerous pad interconnects and pad openings.

The line pattern of an interconnect, as discuss, may include different patterns. For example, an interconnect pattern may include a rounded corner structure. For example, the interconnect pattern is devoid of 90° corner structures and any angled or corner structure contained in the pad interconnect pattern is less than 90°. In one embodiment, a rounded corner in a pad interconnect is rounded to less than 90°. Corner rounding, in one embodiment, includes chamfering to reduce a 90° corner to 45°. By eliminating 90° corner structures in the pad interconnects, cracks in the passivation layer caused by stress are reduced or eliminated. Device reliability as well as yields are improved due to corner rounding.

Corner rounding of the interconnect pattern, in one embodiment, is achieved using optical proximity correction (OPC). For example, the layout of the pad interconnect level, which include interconnect patterns, is processed by OPC. The OPC analyses the layout and converts all 90° structures to 45°. Alternatively, the layout is specifically designed with corner rounding to eliminate 90° structures. Other techniques for corner rounding may also be useful.

Figure 4B:
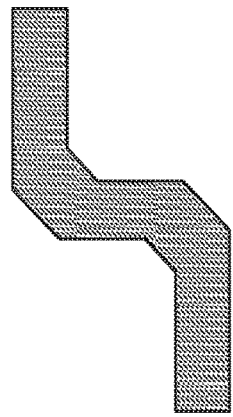
Figure 4B:
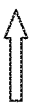
Figure 4B:
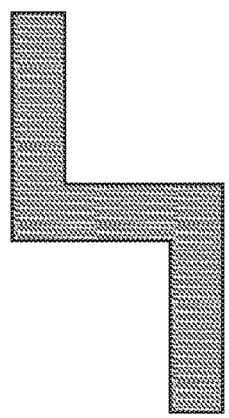
Figure 4C:
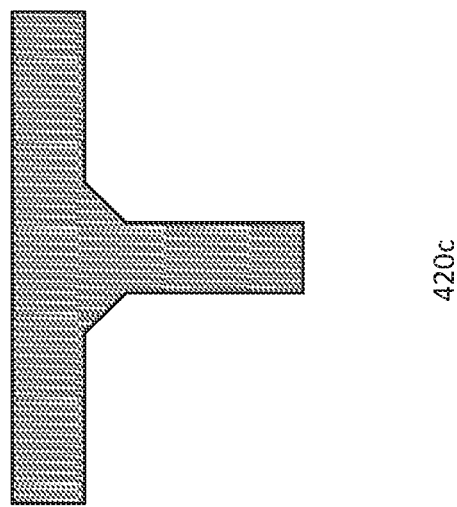
Figure 4C:
Figure 4C:
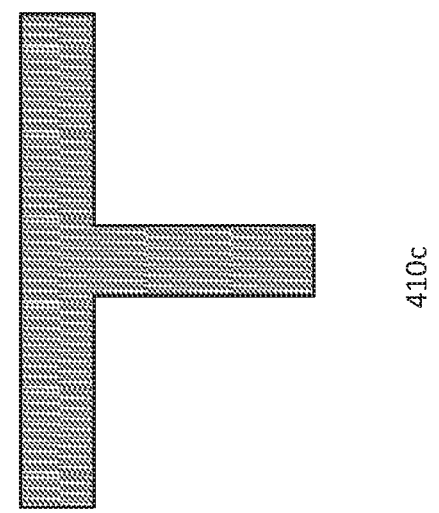
Figure 4D:
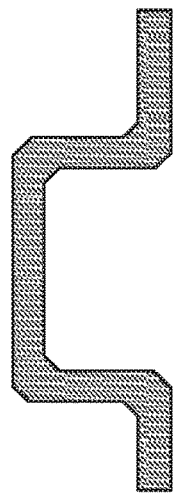
Figure 4D:
Figure 4D:
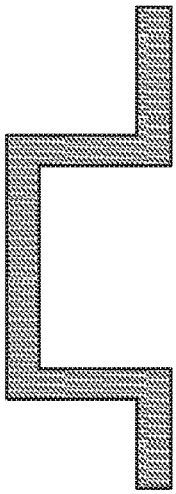

FIGS. 4a-4d show various patterns or structures 400a-400d that may be included in a pad interconnect. Referring to FIG. 4a, an L-shaped pad interconnect structure 410a is shown. A modified L-shaped pad interconnect structure 420a is illustrated with corner rounding. As shown, the 90° bend is chamfered to 45°. FIG. 4b shows a Z-shaped pad interconnect structure 410b. A modified Z-shaped pad interconnect structure 420b with corner rounding is illustrated. The 90° bends are chamfered to 45°. As for FIG. 4c, a T-shaped pad interconnect structure 410c is shown. A modified T-shaped pad interconnect structure 420c includes corner rounding. The 90° bends of the T-shaped pad interconnect are chamfered to 45°. FIG. 4d shows a U-shaped pad interconnect structure 410d. A modified U-shaped pad interconnect structure 420d with corner rounding is illustrated. The 90° bends of the U-shaped pad interconnect structure are chamfered to 45°. Other types of pad interconnect structures which include 90° may also have their 90° corners rounded.

Figure 5B:
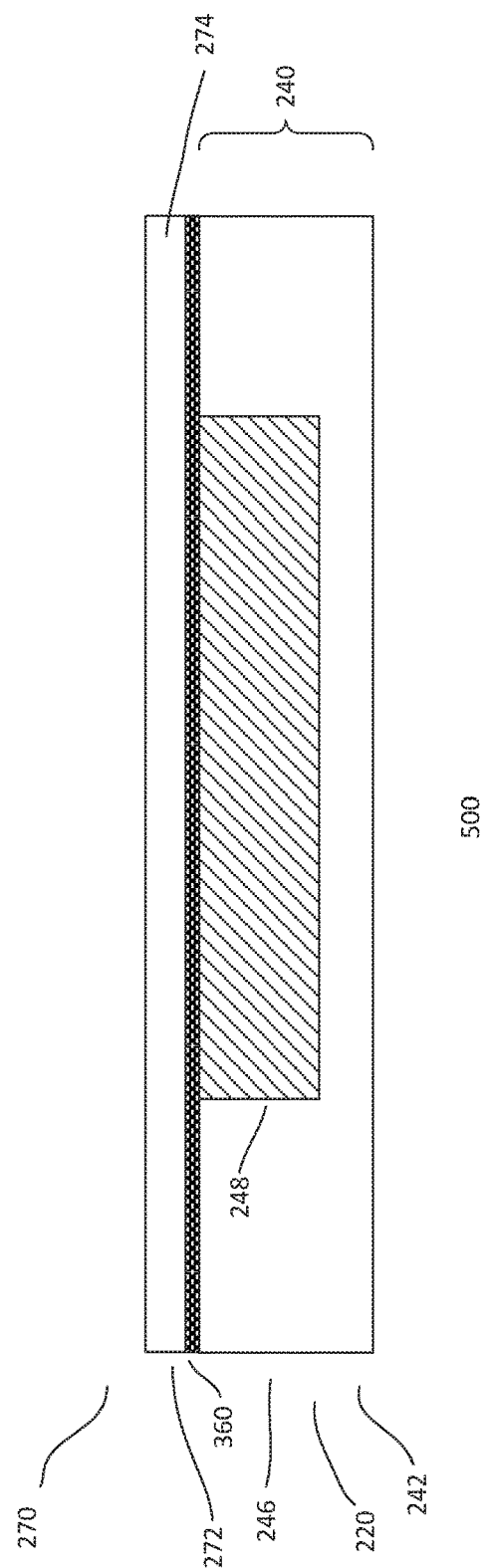

FIGS. 5a-5f show an embodiment of a process for forming a device 500. The process relates to forming pad interconnects in a device. Referring to FIG. 5a, a simplified portion of the device is shown. The device may be similar to that described in FIGS. 2, 3, and 4a. Common elements may not be described or described in detail. The device, for example, includes a substrate (not shown) with a BEOL dielectric 220 having a plurality of ILD levels. However, for simplification, only the uppermost ILD level 240 is shown. The uppermost ILD level, for example, includes an uppermost or top metal level 246 (Mx) with a via level 242 (Vx-1). In the case where the device includes 5 metal levels, the uppermost metal level is M5 and the uppermost via level is V4. Other designations or number of metal levels may also be useful. The metal level, as shown, includes a M5 interconnect 248. The interconnect, for example, is a copper interconnect. Other types of interconnects may also be useful.

Referring to FIG. 5b, a dielectric cap layer 360 is formed over the uppermost ILD level for example, the cap layer is formed on Mx. The cap layer, for example, serves as an etch stop layer. The cap layer, for example, may be a silicon nitride layer. Other types of dielectric materials may also be useful. For example, the cap layer may be a low k dielectric layer, such as a nitrogen doped barrier low-k (nBLOK) layer. The cap layer may be formed by chemical vapor deposition (CVD) or plasma enhanced CVD (PECVD). Forming the cap layer using other deposition techniques may also be useful. The thickness of the cap layer may be about >1,000 Å. Other thicknesses may also be useful.

A pad dielectric layer is 274 is formed over the substrate. For example, the pad dielectric layer is formed on the cap layer. The pad dielectric layer, for example, serves as the pad via level 272 of the pad level 270. In one embodiment, the pad dielectric layer is a silicon oxide layer. Other types of dielectric materials may also be useful. The pad dielectric layer, for example, is formed by CVD to a thickness of about >4,000 Å. Other techniques or thicknesses may also be useful for the pad dielectric layer.

Figure 5C:
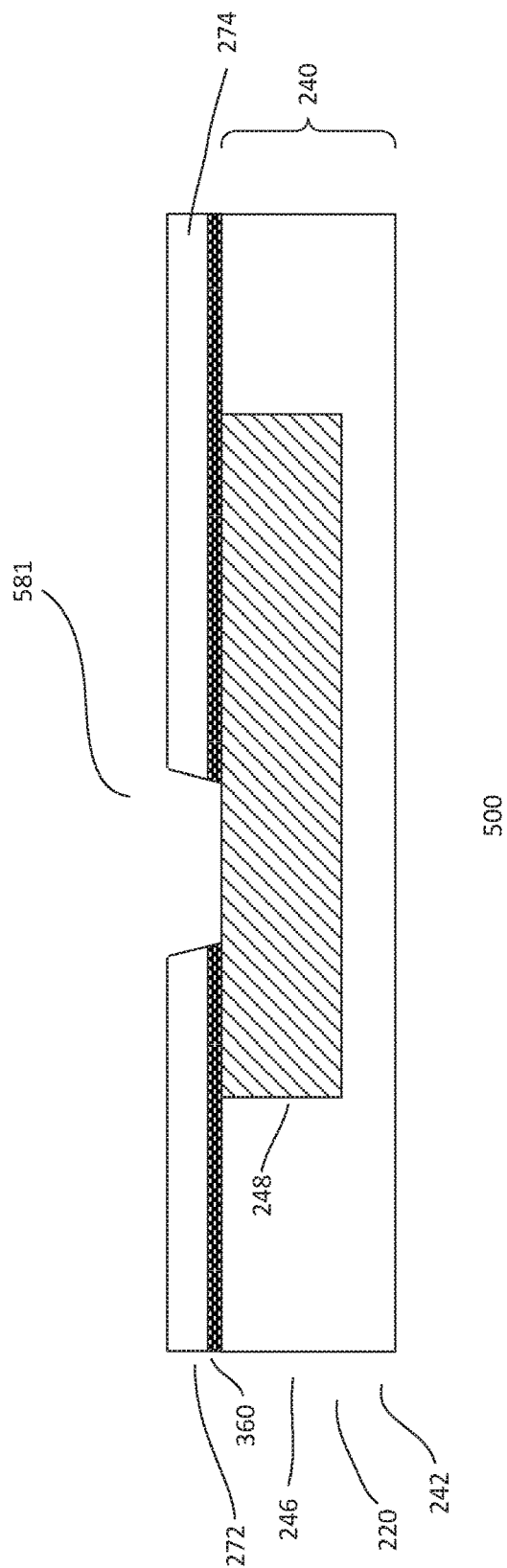

In FIG. 5c, a pad via opening 581 is formed in the via level. The opening, for example, is a pad via opening which exposes the interconnect in Mx. The opening may be formed by mask and etch techniques. For example, a patterned photoresist mask may be formed over the pad dielectric layer, serving as an etch mask. The patterned resist mask may be formed by depositing a resist layer on the substrate, exposing it by lithography with an exposure source using a reticle, and developing the resist layer to transfer the pattern of the reticle to the resist layer. To improve lithographic resolution and anti-reflective layer may be provided under the resist layer. An etch, such as RIE, may be performed to pattern the pad dielectric and cap layers using the patterned resist etch mask. In one embodiment, the etch transfers the pattern of the mask to the pad dielectric and cap layers. This, for example, exposes the interconnect in Mx.

Figure 5D:
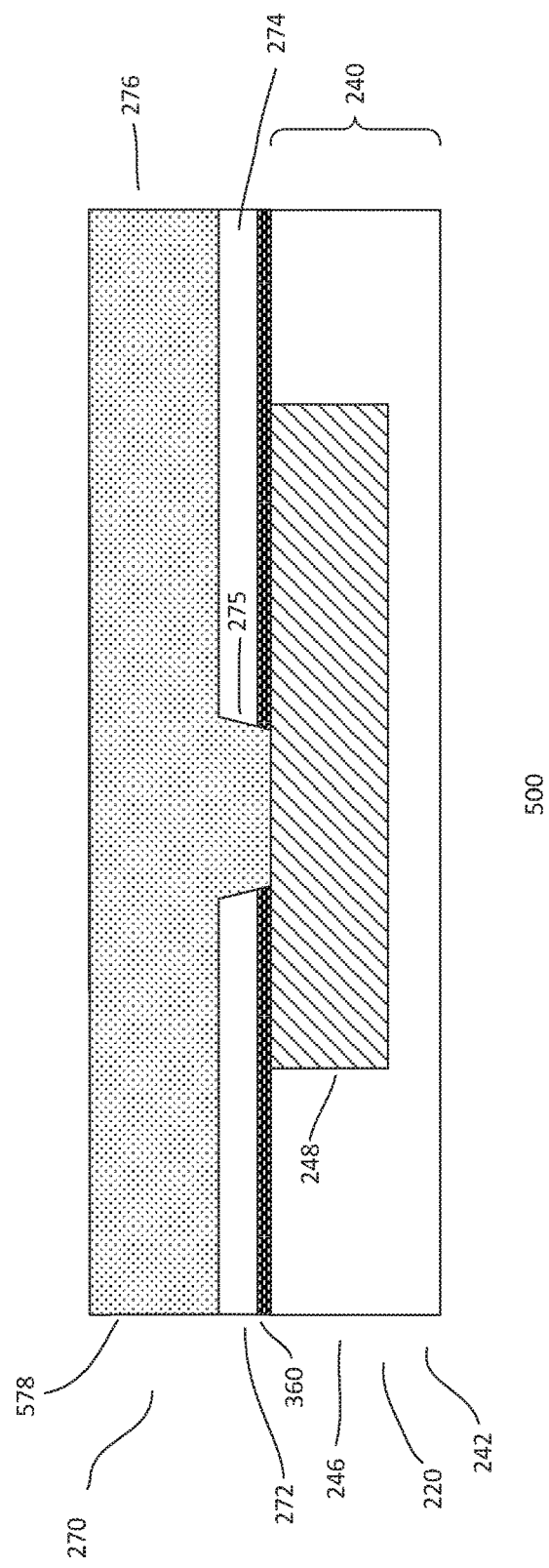

A conductive layer 578 is formed on the substrate, covering the pad dielectric layer and filling the pad via opening, as shown in FIG. 5d. The conductive layer serves as a pad interconnect level 276. The conductive layer, for example, is an aluminum or aluminum alloy layer, such as aluminum-copper. Other types of conductive layers may also be useful. The conductive layer, for example, is formed by sputtering. Other deposition techniques may also be useful. The thickness of the conductive layer may be about >20,000 Å. Providing conductive layers having other thicknesses may also be useful.

Figure 5E:
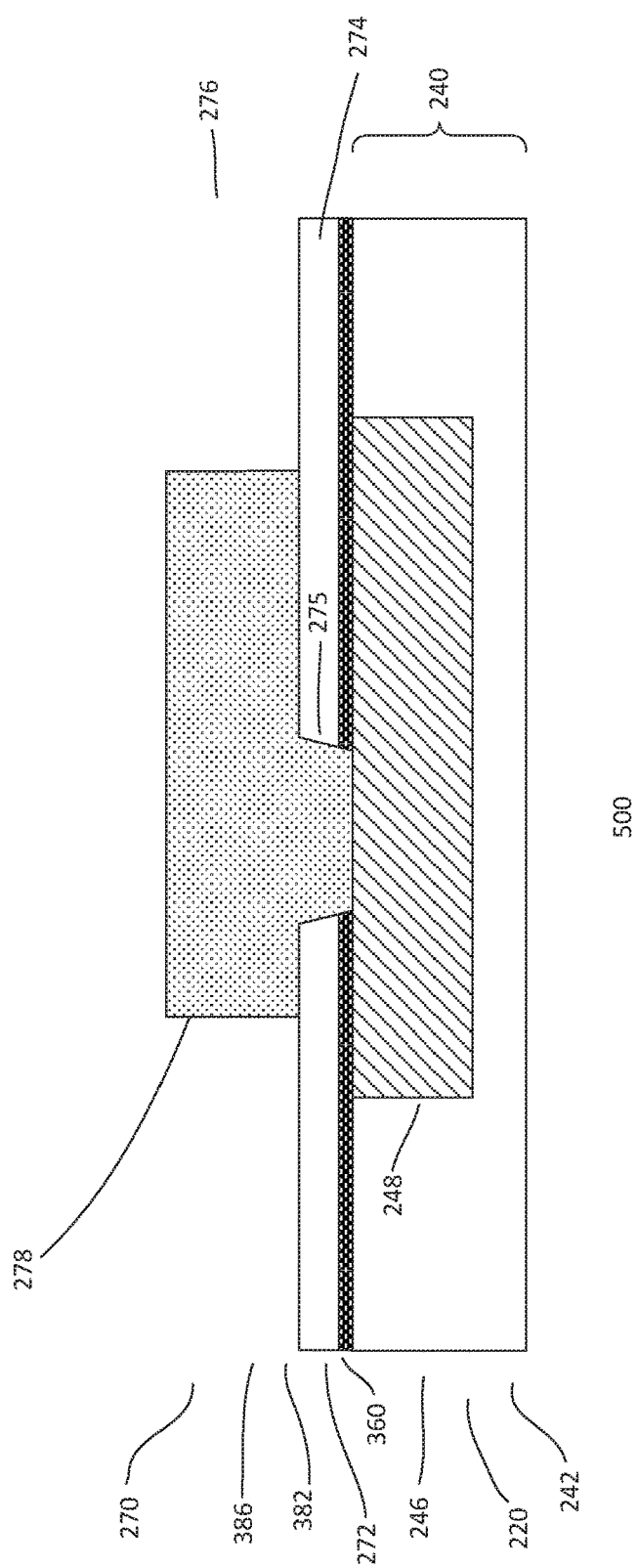

Referring to FIG. 5e, the conductive layer is patterned to form a pad interconnect 278. Patterning the conductive layer to form the pad interconnect may be achieved by mask and etch techniques. For example, a patterned photoresist mask may be formed over the conductive layer. An etch, such as RIE, may be used to pattern the conductive layer with a patterned resist mask. In one embodiment, the pad interconnect is devoid of 90° angles. For example, the pad interconnect includes rounded corners without 90° angles.

Figure 5F:
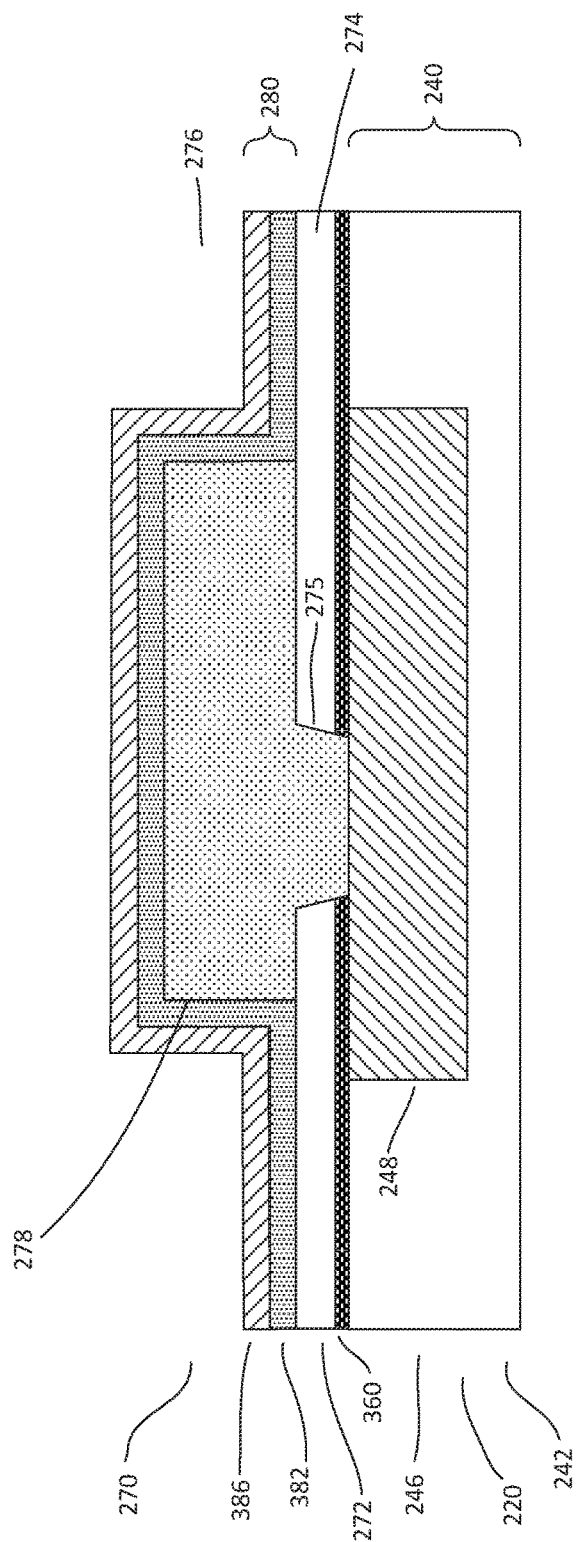

Referring to FIG. 5f, a passivation layer 280 is formed over the pad interconnect. The passivation layer, as shown, lines the pad interconnect and surface of the pad dielectric layer. In one embodiment, the passivation layer includes a nitride layer 386 over an oxide layer 382. For example, the passivation layer is an oxide/nitride stack. Other types of passivation layers or stacks may also be useful. The thickness of oxide layer may be about 4,000-6,000 Å and the thickness of the nitride layer may be about 4,000-6,000 Å. Preferably, the thickness of the oxide layer is about 5,000 Å while the thickness of the nitride layer is about 4,800 Å. Other thicknesses may also be useful. In one embodiment, the oxide and nitride layers of the passivation stack may be formed by CVD. Other forming techniques may also be useful.

The process continues to complete the device. For example, pad openings may be formed in the passivation layer to expose the pad interconnect at pad regions. Additional processes may be performed, such as dicing the wafer to singulate the device, packaging and testing, to complete the device. Other processes may be also be performed.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device, comprising:
   providing a substrate prepared with circuit components and a back-end-of-line (BEOL) dielectric layer with interconnects;
   forming a pad dielectric layer over the BEOL dielectric layer, wherein the pad dielectric layer includes a pad via opening which exposes a surface of one of the interconnects in the BEOL dielectric layer;
   depositing a pad conductive layer on a surface of the substrate, wherein the pad conductive layer fills the pad via opening and covers the pad dielectric layer;
   depositing a resist layer on the pad conductive layer;
   exposing the resist layer with a pad level reticle containing a pad interconnect pattern layout which is devoid of 90° angles due to corner rounding provided in the pad interconnect pattern layout by optical proximity correction;
   developing the resist layer to transfer the pad interconnect pattern layout on the pad level reticle to the resist layer to form a patterned resist layer;
   etching the pad conductive layer to remove portions unprotected by the patterned resist layer to form a plurality of pad interconnects separated by spaces, wherein the pad interconnects have a pad interconnect pattern which is devoid of 90° angles; and
   forming a composite passivation liner on the pad dielectric layer and the pad interconnects, wherein the composite passivation liner includes a first dielectric liner conformally lining the pad dielectric layer and the pad interconnects, the composite passivation liner includes a second dielectric liner disposed on the first dielectric liner, the first dielectric liner is comprised of silicon oxide and has a thickness of about 4,000 Å to about 6,000 Å, the second dielectric liner is comprised of silicon nitride and has a thickness of about 4,000 Å to 6,000 Å, and the second passivation dielectric liner conformally lines the first dielectric liner.

2. The method of claim 1 wherein etching the pad conductive layer comprises:
   over-etching the pad conductive layer to ensure complete removal of portions of the pad conductive layer unprotected by the patterned resist layer.

3. The method of claim 1 wherein the pad interconnects having the pad interconnect pattern which is devoid of 90° angles functions to increase the integrity of the composite passivation liner in thermal cycle testing ranging from about −65° C. to about 150° C.

4. The method of claim 1 wherein the pad interconnect pattern includes angles of about 45°.

5. The method of claim 1 wherein the pad conductive layer has a thickness greater than about 20,000 Å.

6. The method of claim 1 wherein the composite passivation liner conformally lines the pad dielectric layer and the pad interconnects without filling the spaces between the pad interconnects.

7. The method of claim 1 wherein the second dielectric liner is disposed completely and directly on the first dielectric liner.

* * * * *